(12) United States Patent
Perry

(10) Patent No.: US 7,873,934 B1
(45) Date of Patent: Jan. 18, 2011

(54) METHOD AND APPARATUS FOR IMPLEMENTING CARRY CHAINS ON FIELD PROGRAMMABLE GATE ARRAY DEVICES

(75) Inventor: Steven Perry, High Wycombe (GB)

(73) Assignee: Altera Corporation, San Jose, CA (US)

( * ) Notice: Subject to any disclaimer, the term of this patent is extended or adjusted under 35 U.S.C. 154(b) by 448 days.

(21) Appl. No.: 11/986,595

(22) Filed: Nov. 23, 2007

(51) Int. Cl.
  *G06F 17/50* (2006.01)
(52) U.S. Cl. .............. 716/16; 716/2; 716/4; 716/5; 716/6; 716/7; 716/18
(58) Field of Classification Search .......... 716/6, 716/7, 16, 18, 2, 4, 5
See application file for complete search history.

(56) References Cited

U.S. PATENT DOCUMENTS

| | | | | |
|---|---|---|---|---|
| 5,548,542 | A * | 8/1996 | Rauth et al. ............. | 708/319 |
| 5,946,219 | A * | 8/1999 | Mason et al. ............ | 716/16 |
| 6,519,754 | B1 * | 2/2003 | McElvain et al. ......... | 716/18 |
| 7,107,568 | B2 * | 9/2006 | Cronquist ............... | 716/18 |
| 7,257,800 | B1 * | 8/2007 | Singh et al. ............. | 716/16 |
| 7,308,664 | B1 * | 12/2007 | Fung et al. .............. | 716/6 |
| 2009/0100122 | A1 * | 4/2009 | Zheng et al. ............ | 708/551 |

OTHER PUBLICATIONS

Juang et al.; "Partition methodology for the final adder in a tree-structure parallel multiplier generator"; Publication Year: 2002; Circuits and Systems, 2002. APCCAS '02. 2002 Asia-Pacific Conference on; vol. 1; pp. 471-474 vol. 1.*
Li et al.; "A design methodology for hybrid carry-lookahead/carry-select adders with reconfigurability"; Publication Year: 2005; Circuits and Systems, 2005. ISCAS 2005. IEEE International Symposium on; pp. 77-80 vol. 1.*

* cited by examiner

*Primary Examiner*—Helen Rossoshek
(74) *Attorney, Agent, or Firm*—L. Cho

(57) ABSTRACT

A method for designing a system to be implemented on a field programmable gate array (FPGA) includes identifying an adder from an intermediate representation of the system. Components on the target device are designated to support and implement the adder as a partitioned adder having a plurality of sub-adders each registering an intermediate result.

24 Claims, 12 Drawing Sheets

METHOD AND APPARATUS FOR IMPLEMENTING CARRY CHAINS ON FIELD PROGRAMMABLE GATE ARRAY DEVICES

TECHNICAL FIELD

Embodiments of the present invention relate to tools such as electronic design automation (EDA) tools for designing systems on target devices such as field programmable gate arrays (FPGAs). More specifically, embodiments of the present invention relate to a method and apparatus for implementing carry chains on FPGA devices.

BACKGROUND

Logic devices such as FPGAs are used to implement large systems that may include million of gates and megabits of embedded memory. The complexity of large systems often requires the use of EDA tools to create and optimize a design for the system onto physical target devices. Among the procedures performed by EDA tools in a computer aided design (CAD) flow are synthesis, mapping, placement, and routing.

During synthesis, a designer inputs a description of the system into the EDA tool. Traditionally, the description of the system includes a register transfer level (RTL) description to describe the operation of synchronous digital circuits. In RTL design, a circuit's behavior is defined in terms of the flow of signals between hardware registers and the logical operations performed on those signals. RTL abstraction is used in hardware description languages such as Verilog and very-high-speed integrated circuit (VHSIC) hardware description language (VHDL) to create high-level representations of a circuit, from which lower-level representations and can be derived.

In the past, the RTL description provided to the EDA tool from the designer would include the appropriate delay elements to support appropriate timing on a specified target device. Thus, when creating the RTL description, familiarity with the characteristics of the architecture of the target device and the specification of resources of the target device would be required by the designer since the RTL description would vary depending on these attributes.

SUMMARY

According to an embodiment of the present invention, an intermediate representation of a system is generated from a description of the system provided by a designer. Based upon a timing requirement of the system and a target device specified by the designer, one or more adders in the system may be designated to be implemented with one or more partitioned adders that utilize a plurality of sub-adders. Partitioning an adder allows intermediate results generated from sub-adders to be registered. This allows the maximum frequency (fmax) of a clock on the target device to be increased to meet the timing requirement. According to an embodiment of the present invention, the system operates at or above the maximum frequency specified by a designer.

A register transfer language (RTL) representation of the system is generated from the intermediate representation of the system. The RTL representation is generated using information regarding unique properties of the target device specified by the designer and specifies how the system is to be implemented on the target device. According to an embodiment of the preset invention, a different RTL representation may be generated from the intermediate representation of the system using information regarding unique properties of a different target device specified by the designer. By performing target specific transformations on an intermediate representation of a system, embodiments of the present invention allow re-targeting a system onto a plurality of devices without requiring a designer to be familiar with all of the properties of the devices. The target specific transformation may include adding pipelined delays to facilitate meeting timing of the system, utilizing unique target specific components to implement components identified in the intermediate representation, and/or other transformations.

BRIEF DESCRIPTION OF THE DRAWINGS

The features and advantages of the present invention are illustrated by way of example and are by no means intended to limit the scope of the present invention to the particular embodiments shown.

FIG. 1 illustrates a block diagram of a computer system in which an EDA tool may be implemented on.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
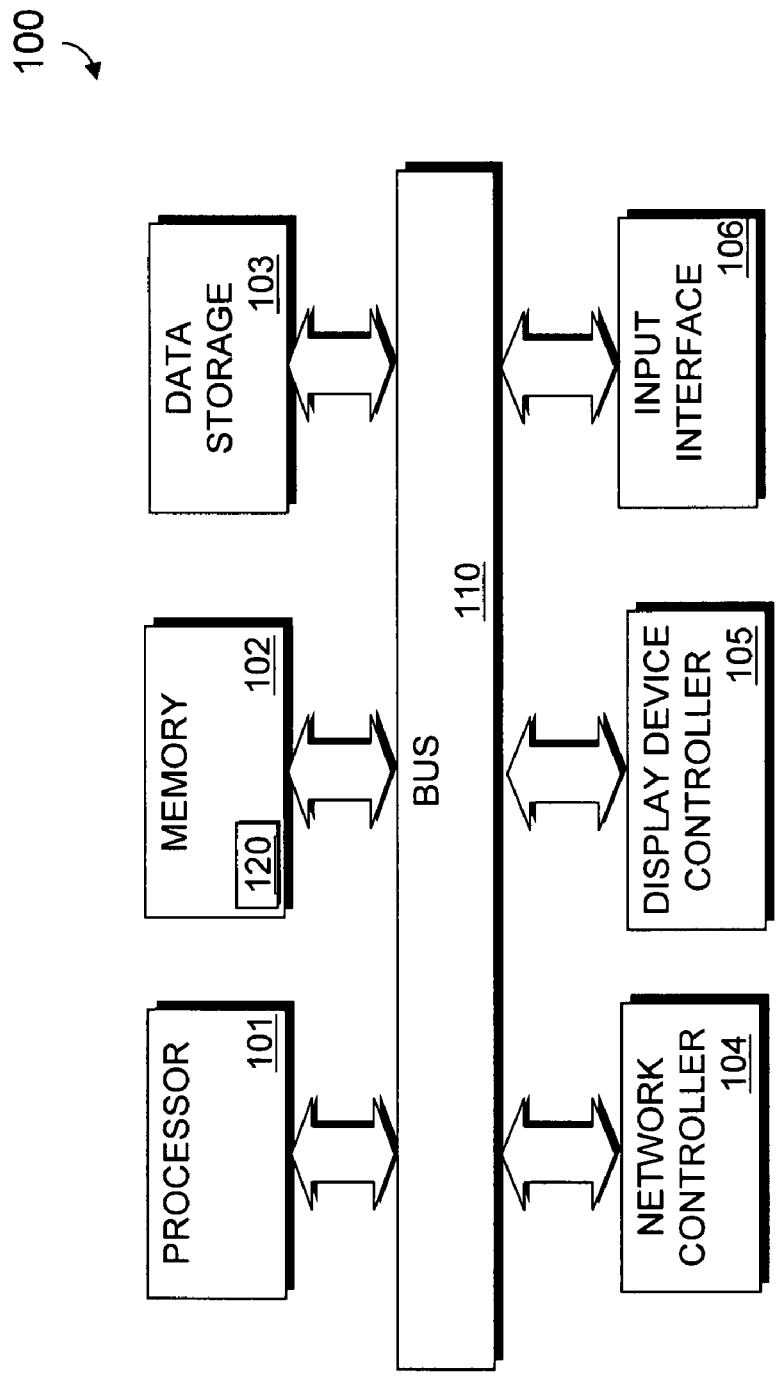

FIG. 1 is a block diagram of an exemplary computer system 100 in which an example embodiment of the present invention resides. The computer system 100 may be used to implement a system designer such as EDA tool. The computer system 100 includes a processor 101 that processes data signals. The processor 101 is coupled to a bus 110 that transmits data signals between components in the computer system 100. The bus 110 may be a single bus or a combination of multiple buses. The computer system 100 includes a memory 102. The memory 102 may be a dynamic random access memory device, a static random access memory device, and/or other memory device. The memory 102 may store instructions and code represented by data signals that may be executed by the processor 101. A data storage device 103 is coupled to the bus 110. The data storage device 103 may be a hard disk drive, a floppy disk drive, a CD-ROM device, a flash memory device or other mass storage device.

A network controller 104 is coupled to the bus 110. The network controller 104 may link the computer system 100 to a network of computers (not shown) and supports communication among the machines. A display device controller 105 is coupled to the bus 110. The display device controller 105 allows coupling of a display device (not shown) to the computer system 100 and acts as an interface between the display device and the computer system 100. An input interface 106 is coupled to the bus 110. The input interface 106 may be, for example, a keyboard and/or mouse controller or other input interface. The input interface 106 allows coupling of an input device to the computer system 100 and transmits data signals from an input device to the computer system 100. It should be appreciated that computer systems having a different architecture or having different components may also be used to implement the computer system 100.

According to an embodiment of the present invention, a system designer 120 may reside in memory 102 and be executed by the processor 101. The system designer 120 may operate to synthesize, map, place and route a system onto a target device. The system designer 120 generates an intermediate representation of a system from a description of the system provided by a designer. A register transfer language (RTL) representation of the system is generated from the intermediate representation of the system. The RTL representation is generated using information regarding unique properties of a target device specified by the designer and specifies how the system is to be implemented on the target device. According to an embodiment of the preset invention, a different RTL representation may be generated from the intermediate representation of the system using information regarding unique properties of a different target device specified by the designer. By performing target specific transformations on an intermediate representation of a system, embodiments of the present invention allow re-targeting a system onto a plurality of devices without requiring a designer to be familiar with all of the properties of the devices. The target specific transformation may include adding delay components to facilitate timing of the system, utilizing unique target specific components to implement. According to an embodiment of the present invention, a bit-accurate, cycle-accurate simulation model is generated from the intermediate representation of the system. The intermediate representation may be used to perform resource estimates. For example, the number of LUTs, multipliers, and memories used by each functional unit may be computed to provide feedback to a designer.

Figure 2:
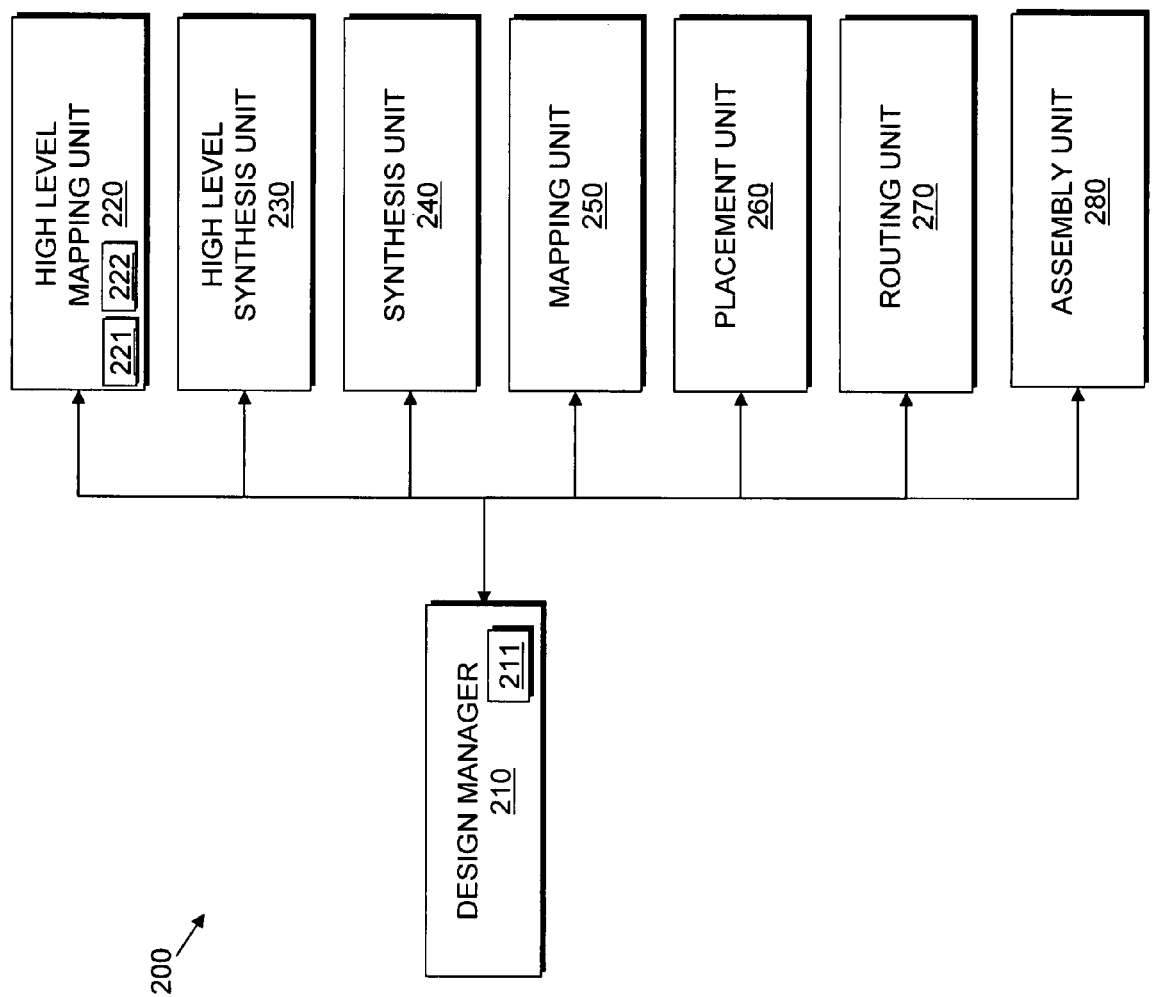
FIG. 2 illustrates a system designer according to an exemplary embodiment of the present invention.

FIG. 2 illustrates a system designer 200 according to an embodiment of the present invention. The system designer 200 may be an EDA tool for designing a system on a target device such as an FPGA or other circuitry. FIG. 2 illustrates modules implementing an embodiment of the system designer 200. According to one embodiment, the modules represent software modules and system design may be performed by a computer system such as the one illustrated in FIG. 1 executing sequences of instructions represented by the modules shown in FIG. 2. Execution of the sequences of instructions causes the computer system to support system design as will be described hereafter. In alternate embodiments, hard-wire circuitry may be used in place of or in combination with software instructions to implement embodiments of present invention. Thus, embodiments of present invention are not limited to any specific combination of hardware circuitry and software.

The system designer 200 includes a designer manager 210. The designer manager 210 is connected to and transmits data between the components of the system designer 200. The designer manager 210 also generates an intermediate representation of the system from a description of the system provided by a designer. The designer may use the designer manager 210 to create a structural netlist using a programming language construct supported by the designer manager 210. Alternatively, the designer may use a graphical user interface tool supported by the designer manager 210 to create a block based schematic that may be converted into a structural netlist. The graphical user interface tool may include a library of functional units 211 that may be selected and connected together to form the block based schematic. The library of functional units 211 may be technology independent and applied to target devices of any architecture. The structural netlist describes the components and connectivity of the system.

The design manager 210 allows the designer to provide a description of the system at a level of detail that does not include pipelined delays that may be implemented by registers or other delay components that allow the system to satisfy timing requirements such as operating at or above a maximum frequency of a clock of the system specified by the designer. Thus, with the design manager 210, a designer may provide a description of the system that may be applicable to more than one target devices as opposed to a description suited for a specific target device. The structural netlist functions as an intermediate representation of the description of the system. According to an embodiment of the present invention, algorithmic delays may still be provided by a designer. Algorithmic delays may be described as delays which are intrinsic to an operation of an algorithm, such as a delay line in a Finite Infinite Response (FIR) filter, a feed back delay in an Infinite Impulse Response (IIR) filter, or other types of algorithmic delays that are seen in "text book" descriptions of algorithms.

The system designer 200 includes a high level technology mapping unit 220. The high level technology mapping unit 220 receives an identity of a selected or specified target device for which the system is to be implemented on. According to an embodiment of the present invention, the target device is selected or specified by the designer. The target device may be, for example, a specific field programmable gate array (FPGA) manufactured by Altera® Corporation such as APEX™, Stratix™, Cyclone™, Stratix™ II, Cyclone™ II, Stratix™ III, or Cyclone™ III or a FPGA manufactured by Xilinx® Inc. such as Virtex™ and Virtex™ II, Virtex IV™, or Virtex V™ or an FPGA having a different architecture. Each target device may have a unique architecture with resources having unique properties and characteristics. The high level technology mapping unit 220 identifies one or more components in the intermediate representation of the description of the system that could be implemented or represented with one or more unique components on the target device where the one of more unique components on the target device is capable of implementing the functionalities of the one or more components in the intermediate representation of the description of the system efficiently.

According to an embodiment of the system designer 200, the high level technology mapping unit 220 identifies an adder (a carry chain). The high level technology mapping unit 220 may include a timing analysis unit 221. The timing analysis unit 221 determines whether a data path through the adder satisfies a timing requirement of the system. If the data path is a critical path and does not satisfy a timing requirement of the system, the timing analysis unit 221 may determine that instead of implementing the adder as a single component that it may be more beneficial to implement the adder with a partitioned adder that utilize a plurality of sub-adders. Partitioning an adder allows intermediate results generated from sub-adders to be registered. This allows the maximum frequency of a clock on the target device may be increased to meet the timing requirement. According to an embodiment of the timing analysis unit 221, timing analysis may be performed to determine how an adder should be partitioned and how many partitions should be made.

The high level technology mapping unit 220 may include a partitioning unit 222 that identifies components on the target device to support and implement the adder as a partitioned adder having a plurality of sub-adders. According to an embodiment of the high level technology mapping unit, the partitioning unit 222 may designate a separate sub-adder for each partition of an adder, a separate memory to input data into each sub-adder, and/or a separate memory to receive data from each sub-adder. Each sub-adder may add together a first portion of two N bit numbers and provide a carry value to the input of a next sub-adder that adds together a second portion of the two N bit numbers. According to an embodiment of the high level technology mapping unit, the number of logic elements used for implementing a partitioned adder is P*N+P, where P is a number of partitions in an adder and N is a number of bits of the adder.

The system designer 200 includes a high level synthesis unit 230. The high level synthesis unit 230 adds pipelined delays onto the intermediate representation of the description of the system. According to an embodiment of the present invention, the pipelined delays are implementation delays that allow the system to satisfy timing requirements such as operating at or above the maximum frequency of a clock in the system as specified by a designer. The pipelined delays are added by the high level synthesis unit 230 which takes into consideration the architecture of the target device selected and the properties and characteristics of the resources on the target device that may have been selected at 220. Each target device may have a unique architecture with resources having unique properties and timing that would require a different number or configuration of registers and/or other delay components in the design to make the system operate efficiently. According to an embodiment of the present invention, algorithmic delays may be distributed as part of adding pipelined delays onto the intermediate representation of the description of the system. The high level synthesis unit 230 also generates a register transfer language (RTL) representation of the system from the intermediate representation of the description of the system. The RTL representation may be in a hardware description languages such as Verilog or very-high-speed integrated circuit (VHSIC) hardware description language (VHDL).

The system designer 200 includes a synthesis unit 240 that performs synthesis. The synthesis unit 240 generates a logic design of a system to be implemented on the target device. According to an embodiment of the system designer 200, the synthesis unit 240 takes a conceptual HDL design definition and generates an optimized logical representation of the system. The optimized logical representation of the system generated by the synthesis unit 240 may include a representation that has a minimized number of functional blocks and registers, such as logic gates and logic elements, required for the system. Alternatively, the optimized logical representation of the system generated by the synthesis unit 240 may include a representation that has a reduced depth of logic and that generates a lower signal propagation delay.

The system designer 200 includes a technology mapping unit 250 that performs technology mapping. The technology mapping unit 250 determines how to implement the functional blocks and registers in the optimized logic representation utilizing specific resources such as cells on a target device thus creating an optimized "technology-mapped" netlist. The technology-mapped netlist illustrates how the resources (cells) on the target device are utilized to implement the system. In an embodiment where the target device is an FPGA or PLD, the technology-mapped netlist may include cells such as LABs, registers, memory blocks, DSP blocks, IO elements or other components.

The system designer 200 includes a placement unit 260 that performs placement. The placement unit 260 processes the optimized technology-mapped netlist to produce a placement for each of the functional blocks.

The system designer 200 includes a routing unit 270 that performs routing. The routing unit 270 determines the routing resources on the target device to use to provide interconnection between the components implementing functional blocks and registers of the logic design.

The system designer 200 includes an assembly unit 280 that performs an assembly procedure that creates a data file that includes the design of the system generated by the system designer 200. The data file may be a bit stream that may be used to program the target device. The assembly unit 280 may output the data file so that the data file may be stored or alternatively transmitted to a separate machine used to program the target device. It should be appreciated that the assembly unit 280 may also output the design of the system in other forms such as on a display device or other medium.

FIG. 2 illustrates an exemplary block diagram of a system designer 200. It should be appreciated that addition components may be implemented on the system designer 200, that not all of the components illustrated are necessary to implement the system designer 200, and that the illustrated components may be substituted with other components.

Figure 3:
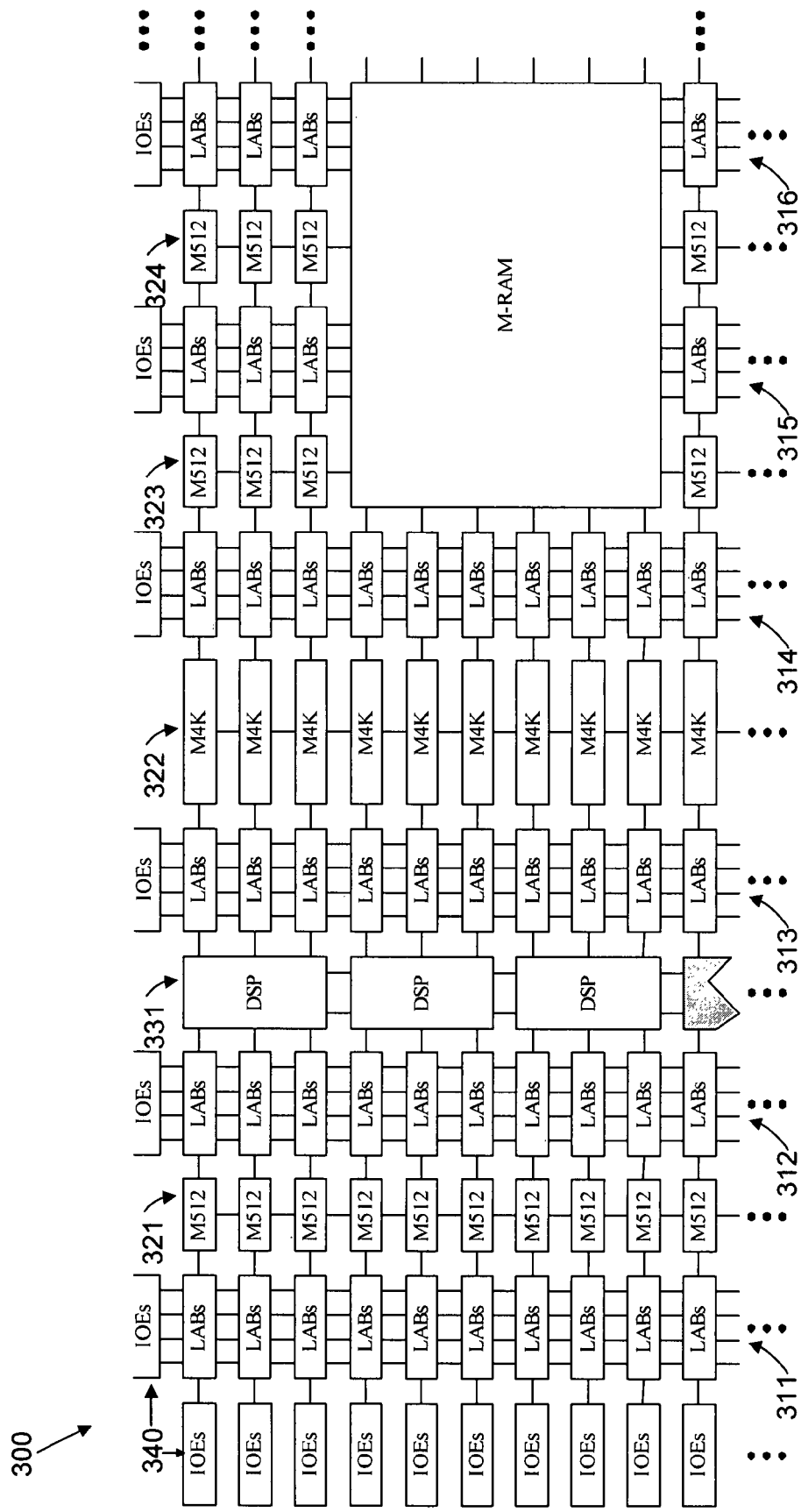
FIG. 3 illustrates an exemplary target device according to an exemplary embodiment of the present invention.

FIG. 3 illustrates an exemplary target device 300 in which a system may be implemented on 300 utilizing an FPGA according to an embodiment of the present invention. According to one embodiment, the target device 300 is a chip having a hierarchical structure that may take advantage of wiring locality properties of circuits formed therein.

The target device 300 includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in Stratix™ manufactured by Altera® Corporation, or a combinational logic block (CLB) such as those found in Virtex™ manufactured by Xilinx® Inc. In this embodiment, the logic block may include a four input lookup table (LUT) with a configurable register. According to an alternate embodiment of the present invention, the logic block may operate similarly to an adaptive logic module (ALM), such as those found in Stratix™ II manufactured by Altera® Corporation. LABs are grouped into rows and columns across the target device 300. Columns of LABs are shown as 311-316. It should be appreciated that the logic block may include additional or alternate components.

The target device 300 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the target device in between selected LABs or located individually or in pairs within the target device 300. Columns of memory blocks are shown as 321-324.

The target device 300 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the target device 300 and are shown as 331.

The target device 300 includes a plurality of input/output elements (IOEs) 340. Each IOE feeds an I/O pin (not shown) on the target device 300. The IOEs are located at the end of LAB rows and columns around the periphery of the target device 300. Each IOE includes a bidirectional I/O buffer and a plurality of registers for registering input, output, and output-enable signals. When used with dedicated clocks, the registers provide performance and interface support with external memory devices.

The target device 300 may include routing resources such as LAB local interconnect lines, row interconnect lines ("H-type wires"), and column interconnect lines ("V-type wires") (not shown) to route signals between components on the target device.

FIG. 3 illustrates an exemplary embodiment of a target device. It should be appreciated that a system may include a plurality of target devices, such as that illustrated in FIG. 3, cascaded together. It should also be appreciated that the target device may include programmable logic devices arranged in a manner different than that on the target device 300. A target device may also include FPGA resources other than those described in reference to the target device 300.

Figure 4:
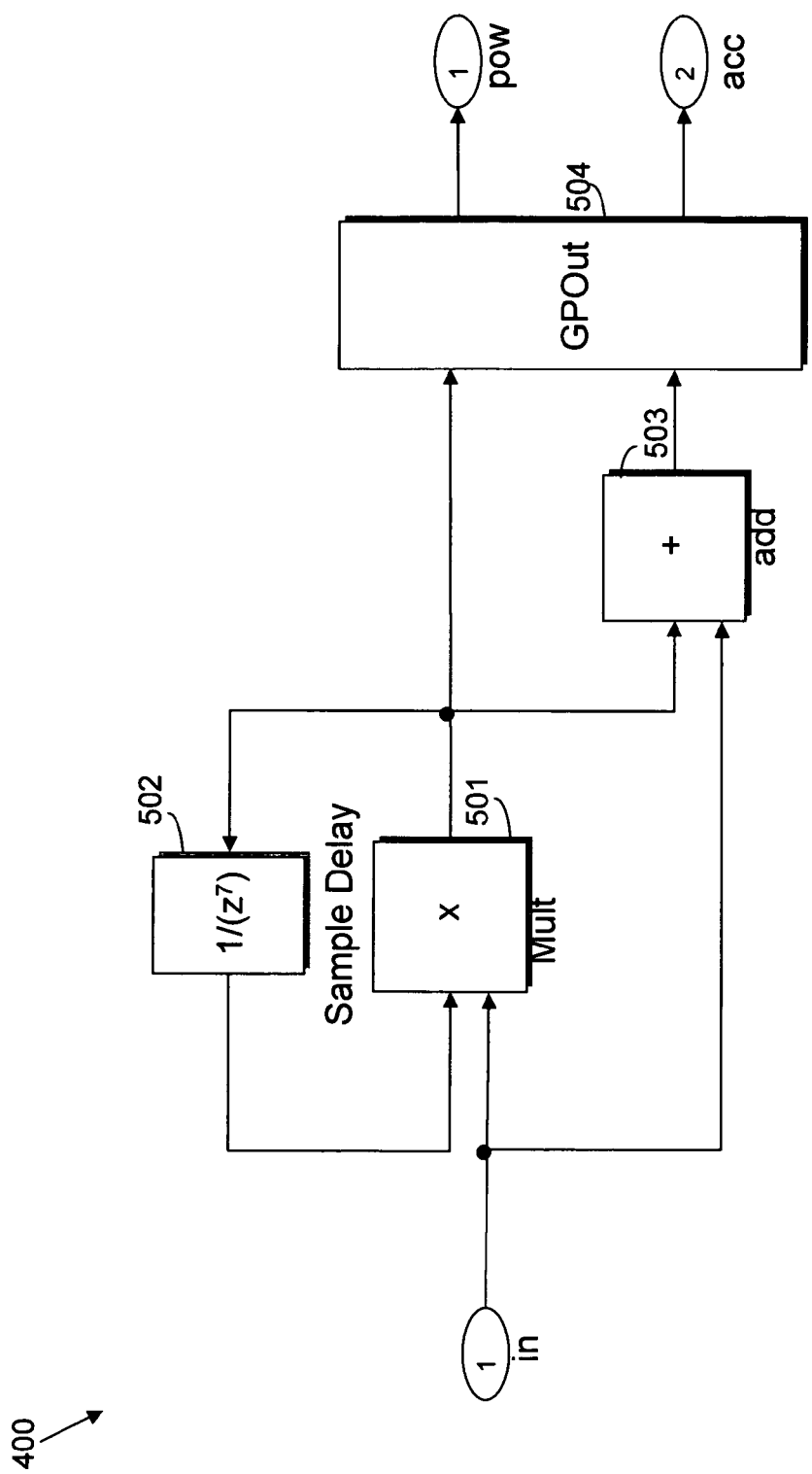
FIG. 4 illustrate a block based schematic according to an exemplary embodiment of the present invention.

FIG. 4 illustrate a block based schematic 400 that describes a portion of a system according to an exemplary embodiment of the present invention. The block based schematic may be created using a graphical user interface provided by a design manager such as design manager 210 illustrated in FIG. 2. Each of the blocks illustrated represents a functional unit that may be selected from a library such as library 211 illustrated in FIG. 2. FIG. 4 illustrates a multiplication block 401, delay block 402, adder block 403, and a general purpose output block 404. It should be noted that the delay block 402 represents a delay associated with the operation of the system and not with a pipelined delay for how the system is to be implemented on a target device to satisfy timing requirements such as the maximum frequency of a clock.

It should be appreciated that other types of functional units may be available in a library. For example, the library may include the following exemplary functional units.

Abs block: Outputs an absolute of an input.

Add block: Outputs the sum of inputs, a+b.

AddSLoad block: Performs the operation of a registered adder with a synchronous load.

And block: Output logical and of input values, a&b.

ArcTangent: Output an arctangent of the input angle in radians.

BitCombine: Output the bit concatenation of the input values.

BitExtract: Output the bits extracted from the input, and recast as the specified datatype, (datatype)(a>>lsb).

Sequence: Outputs a boolean pulse of configurable duration and phase.

Referring back to FIG. 2, the high level mapping unit 220 may identify one or more components in the intermediate description of the system and represents the one or more components in the description with one or more components on the target device that is capable of implementing the functionalities of the one or more components in the intermediate description of the system efficiently, wherein the component is uniquely available to the target device.

Figure 5:
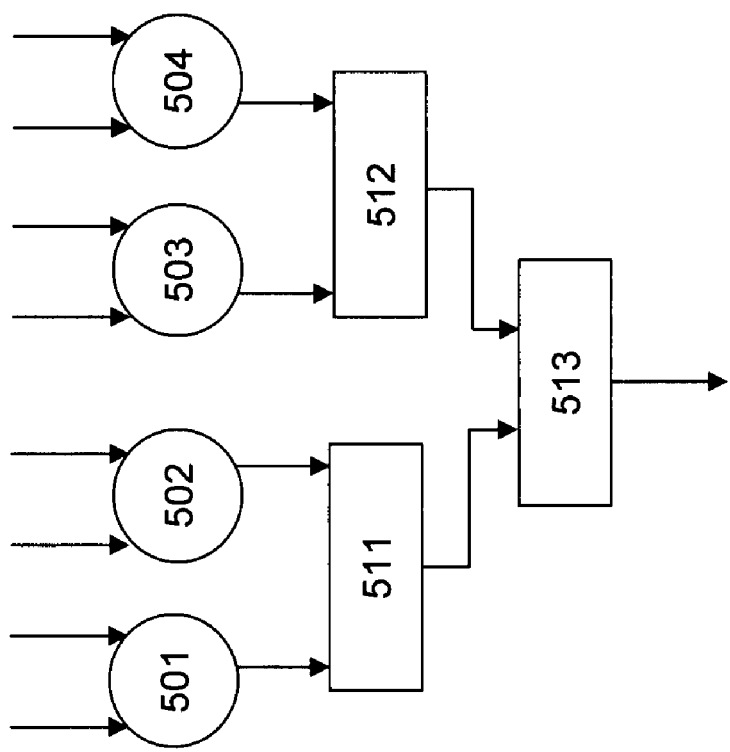
FIG. 5 illustrates a first set of components identified by a high level mapping unit according to an embodiment of the present invention.

FIG. 5 illustrates a first set of components identified by a high level mapping unit according to an embodiment of the present invention. The identified components include a plurality of multipliers 501-504 and a plurality of adders 511-513 that make up an adder tree. According to an embodiment of the present invention, a high level mapping unit determines that the plurality of multipliers 501-504 and the plurality of adders 511-513 should be implemented using a single DSP block available in a selected target device instead of implementing the plurality of multipliers 501-504 and the plurality of adders 511-513 with multipliers and adders in the selected target device.

Figure 6:
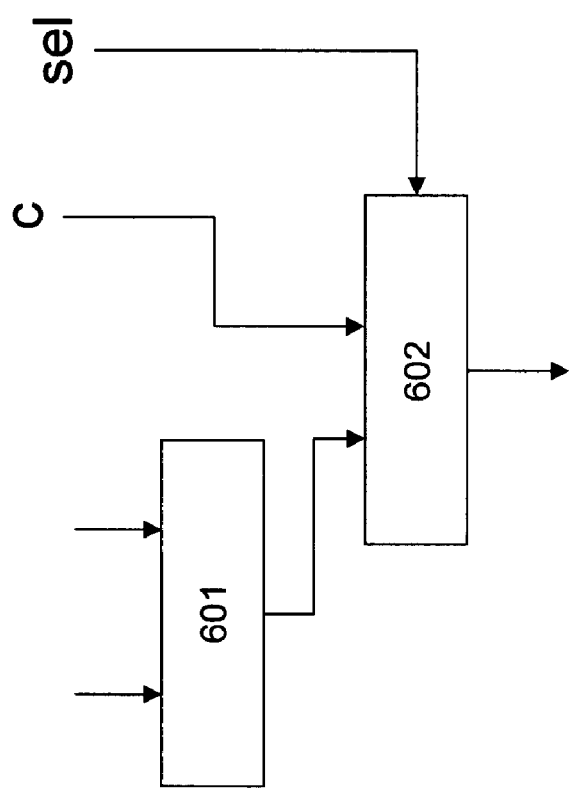
FIG. 6 illustrates a second set of components identified by a high level mapping unit according to an embodiment of the present invention.

FIG. 6 illustrates a second set of components identified by a high level mapping unit according to an embodiment of the present invention. The identified components include an adder 601 and multiplexer 602. According to an embodiment of the present invention, a high level mapping unit determines that the adder 601 and multiplexer 602 should be implemented using a single component Add_SLoad available in a selected target device instead of having to implement the adder 601 and multiplexer 602 with an adder and multiplexer in the selected target device.

Referring back to FIG. 2, it should be appreciated that the high level mapping unit 220 may perform other transformations. For example, the high level mapping unit 220 may determine that algorithmic delays or pipelined delays should be implemented using a specific resource on the target device such as LUTs or other specific memory resources available. The high level mapping unit 220 may determine that a multiplier in the intermediate description of the system should be implemented using a hard multiplier available and already configured on the target device rather than a soft multiplier requiring configuration from LUTs on the target device. The high level mapping unit 220 may determine that a multiplier in the intermediate description of the system should be coupled to a register if the register is required to allow timing in the system to be satisfied on the target device. It should be appreciated that other types of transformations may also be made based on the properties and characteristics of the target devices and the resources available on the target device.

Figures 7A, 7B:
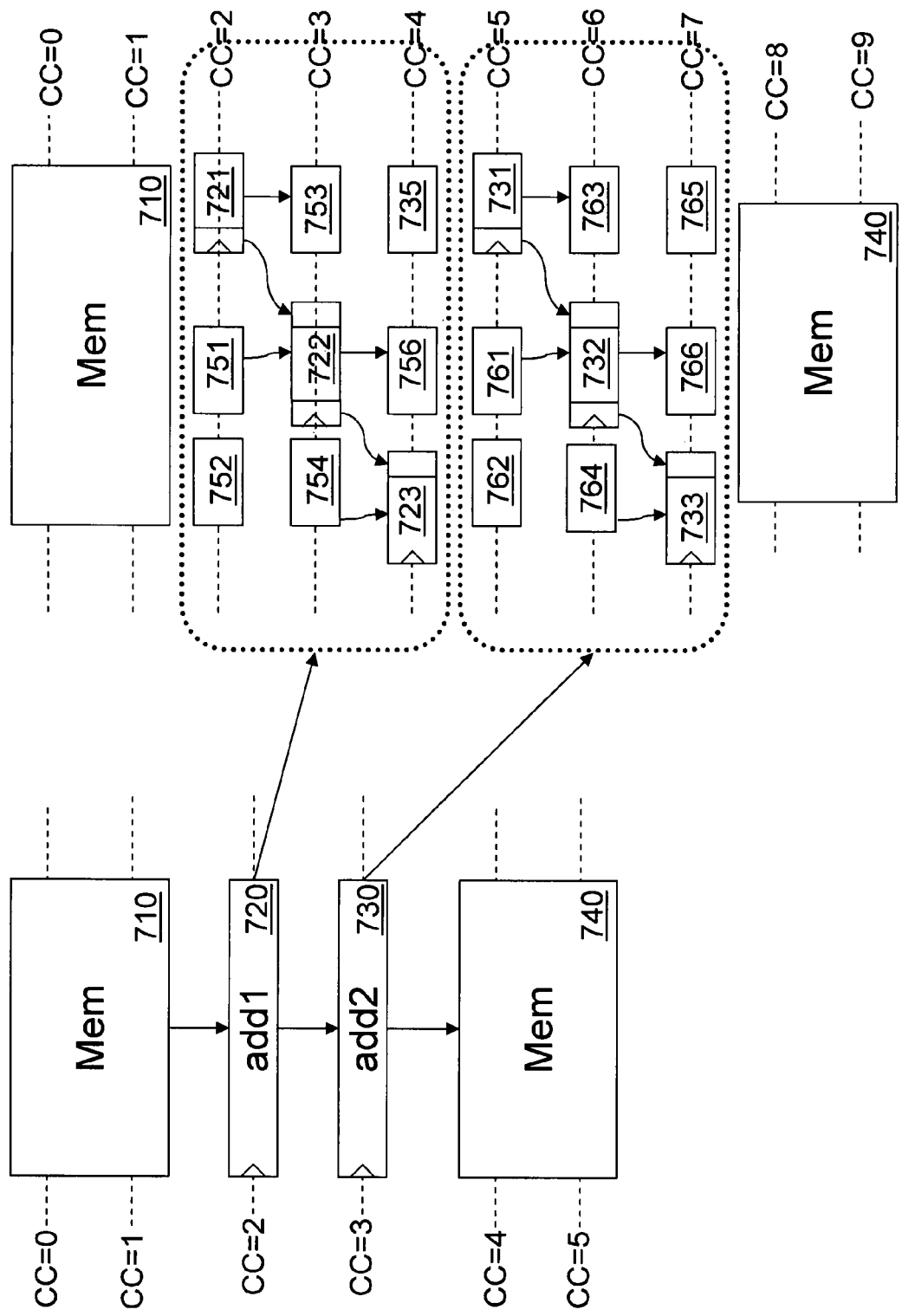
FIG. 7a illustrates an exemplary full data path through components on a target device.
FIG. 7b illustrates an exemplary data path pipelined through components on a target device according to a first embodiment of the present invention.

FIG. 7a illustrates an exemplary full data path through components on a target device. At clock cycle (cc)=2, a first N bit number and second N bit number are output from a first memory component 710 to a first adder 720. The first adder 720 is an N bit adder implemented using a single component. At cc=3, the first adder 720 outputs a first M bit number to a second adder 730. The output of the first adder 720 is the sum of the first and second N bit numbers. The second adder 730 is an M bit adder implemented using a single component. The second adder 730 adds the first M bit number with a second M bit number. The second M bit number may be a constant or a number received from another source. At cc=4, the second adder 730 outputs an L bit number to the second memory component 740. The output of the second adder 730 is the sum of the first and second M bit numbers. The length of an adder (carry chain) may influence the maximum frequency of a clock on a device. When an N bit adder is implemented using a single component, data may travel through N LUTs without being registered.

FIG. 7b illustrates an exemplary data path pipelined through components on a target device according to a first embodiment of the present invention. In this example, a high level mapping unit may determine that it is appropriate to implement the first and second adders 720 and 730 in FIG. 7a as partitioned adders. As shown, the first adder 720 may be partitioned into three sub-adders 721-723. Each of the sub-adders 721-723 may be N/P bit adders, where N is the number of bits of adder 720 and P is the total number of partitions. Each of the sub-adders includes registers. At cc=2, sub-adder 721 receives a first portion of bits (the least significant bits) from the first N bit number and second N bit number from the first memory component 710. Also during cc=2, a second portion of bits (the next significant bits) from the first N bit number and second N bit number are transmitted to a register 751, and a third portion of bits (the most significant bits) from the first N bit number and the second N bit number are transmitted to a second register 752. At cc=3, the sub-adder 721 outputs the first N/P bits of the sum of the first portion of bits from the first N bit number and second N bit number to register 753 and any carry bit to sub-adder 722. Also during cc=3, the register 751 transmits its values to sub-adder 722, and register 752 transmits its values to register 754. At cc=4, register 753 transmits its value to register 755. Also at cc=4, sub-adder 722 outputs the first N/P bits of the sum of the second portion of bits from the first N bit number and second N bit number and any carry bit from sub adder 721 to register 756. The sub-adder 722 also transmits any carry bit to sub-adder 723. Also at cc=4, register 754 transmits its values to the sub-adder 723.

As shown, the second adder 730 may be partitioned into three sub-adders 731-733. Each of the sub-adders 731-733 may be M/P bit adders, where M is the number of bits of adder 730 and P is the total number of partitions. Each of the sub-adders includes registers. At cc=5, sub-adder 731 receives the value from register 755 and a first portion of bits (the least significant bits) from the second M bit number. Also during cc=5, register 761 receives the value from register 756 and a second portion of bits (the next significant bits) from the second M bit number. Register 762 receives the value summed from adder 723 and a third portion of bits (the most significant bits) from the second M bit number. At cc=6, the sub-adder 731 outputs the first M/P bits of the sum of the value from register 755 and the first portion of bits from the first M bit number to register 763. Sub-adder 731 also outputs any carry bit to sub-adder 732. Also during cc=6, the register 761 transmits its values to sub-adder 732. Register 762 transmits its values to register 764. At cc=7, register 763 transmits its value to register 765. Also at cc=7, sub-adder 732 outputs the first M/P bits of the sum of the bits from register 756 and the second portion of bits from the second M bit number to register 766. The sub-adder 732 also transmits any carry bit to sub-adder 733. Also at cc=7, register 764 transmits its values to the sub-adder 733. At cc=8, register 765 transmits its value to memory 740, register 766 transmits its value to memory 740, and sub-adder 733 outputs the sum of the bits from adder 723 and the third portion of bits from the second M bit number to memory 740.

As shown in FIG. 7b, registers 751-756 are required to buffer data between memory 710 and the sub-adders 722-723, and registers 761-766 are required to buffer data between sub-adders 731-732 and memory 740. Partitioning the adders 720 and 730 into sub-adders 721-723 and 731-733 which are capable of registering intermediate results allow the maximum frequency of the clock of the system to be increased.

Figure 8B:
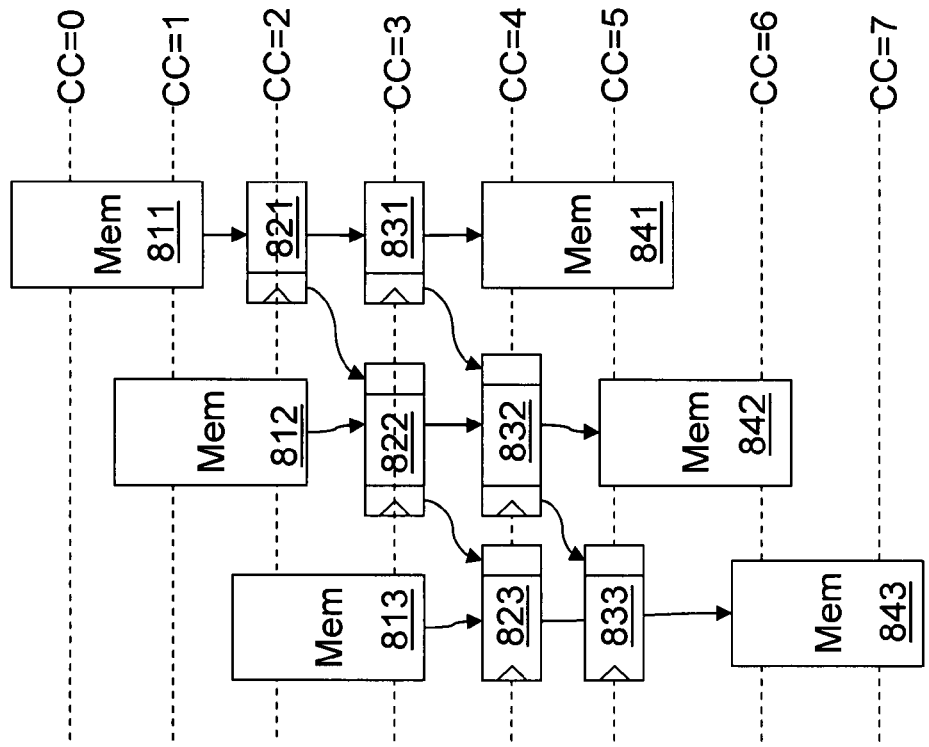
FIG. 8b illustrates an exemplary data path pipelined through components on a target device according to a second embodiment of the present invention.
Figure 8A:
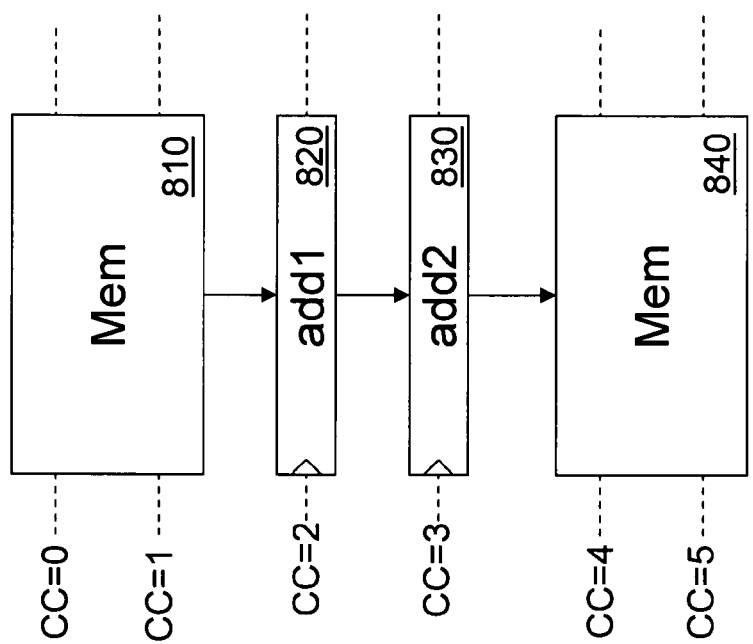
FIG. 8a illustrates an exemplary full data path through components on a target device.

FIGS. 8a and 8b illustrate an example of alternate configuration that may be used to partition adders according to an embodiment of the present invention. FIG. 8a illustrates an exemplary full data path through components on a target device such as the one illustrated in FIG. 7a. At clock cycle (cc)=2, a first N bit number and second N bit number are output from a first memory component 810 to a first adder 820. The first adder 820 is an N bit adder implemented using a single component. At cc=3, the first adder 820 outputs a first M bit number to a second adder 830. The output of the first adder 820 is the sum of the first and second N bit numbers. The second adder 830 is an M bit adder implemented using a single component. The second adder 830 adds the first M bit number with a second M bit number. The second M bit number may be a constant or a number received from another source. At cc=4, the second adder 830 outputs an L bit number to the second memory component 840. The output of the second adder 830 is the sum of the first and second M bit numbers. The length of an adder (carry chain) may influence the maximum frequency of a clock on a device. When an N bit adder is implemented using a single component, data may travel through N LUTs without being registered.

FIG. 8b illustrates an exemplary data path pipelined through components on a target device according to a second embodiment of the present invention. In this example, a high level mapping unit may determine that it is appropriate to implement the first and second adders 820 and 830 in FIG. 8a as partitioned adders. As shown, the first adder 820 may be partitioned into three sub-adders 821-823. Each of the sub-adders 821-823 may be N/P bit adders, where N is the number of bits of adder 820 and P is the total number of partitions. The second adder 830 may be partitioned into three sub-adders 831-833. Each of the sub-adders 831-833 may be M/P bit adders, where M is the number of bits of adder 830 and P is the total number of partitions. Each of the sub-adders includes registers. As shown, the first memory component 810 may be implemented using three separate sub-memory components 811-813 to store portions of bits from the first N bit number and the second N bit number. The second memory component 840 may be implemented using three separate sub-memory components 841-843 to store results from sub-adders 831-833. Each of the sub-memory components 811-813, and 841-843 may be smaller or narrower memories or memories having the same size as memory components 810 and 840.

By using separate sub-memory components 811-813 to store portions of bits from the first and second N bit numbers, the portions of bits may be transmitted at different times or clock cycles, allowing data to be transmitted to the sub-adders 821-823 directly without using registers to buffer the data. In this example, sub-memory component 811 stores a first portion of bits (the least significant bits) from the first and second N bit numbers, sub-memory component 812 stores a second portion of bits (the next significant bits) from the first and second N bit numbers, and sub-memory component 813 stores a third portion of bits (the most significant bits) from the first and second N bit numbers. By using separate sub-memory components 841-843 to store results from sub-adders 831-833, the results may be transmitted at different times or clock cycles, allowing data to be transmitted from the sub-adders 831-841 directly to the sub-memory components 841-943 without using registers to buffer the data.

At cc=2, sub-adder 821 receives a first portion of bits from the first N bit number and second N bit number from the sub-memory component 811. At cc=3, the sub-adder 821 outputs the first N/P bits of its results to sub-adder 831 and any carry bit to sub-adder 822. The sub-adder 831 also receives a first portion of bits from the second M bit number. Also at cc=3, a second portion of bits from the first N bit number and second N bit number are transmitted to sub-adder 822. At cc=4, the first M/P bits of the results from sub-adder 831 are transmitted to sub-memory component 841 and any carry bit from sub-adder 831 is transmitted to sub-adder 832. Also at cc=4, the first N/P bits of the results from sub-adder 822 are transmitted to sub-adder 832 and any carry bit from sub-adder 822 is transmitted to sub-adder 823. The sub-adder 832 also receives a second portion of bits from the second M bit number. Also at cc=4, the sub-adder 823 receives a third portion of bits from the first N bit number and second N bit number are transmitted to sub-adder 823. At cc=5, the first M/P bits of the results from sub-adder 832 are transmitted into sub-memory component 842 and any carry bit from sub-adder 832 is transmitted to sub-adder 833. Also at cc=5, the result from sub-adder 823 is transmitted to sub-adder 833. The sub-adder 833 also receives a third portion of bits from the second M bit number. At cc=6, the results of sub-adder 833 are transmitted to sub-memory component 843.

As shown in FIG. 8b, by partitioning the first and second memory components 810 and 840, additional registers are not required to buffer data between memory components 811-813 and sub-adders 821-823, and additional registers are not required to buffer data between sub-adders 831-832 and sub-memory components 841-843. By directly transmitting results from sub-adder 821 to sub-adder 831, sub-adder 822 to sub-adder 832, and sub-adder 823 to sub-adder 833, adjacent adders are allowed to tessellate in time so that registers are not required to buffer data between the adders. Partitioning the adders 820 and 830 into sub-adders 821-823 and 831-833 which are capable of registering intermediate results allow the maximum frequency of the clock of the system to be increased.

Figure 9:
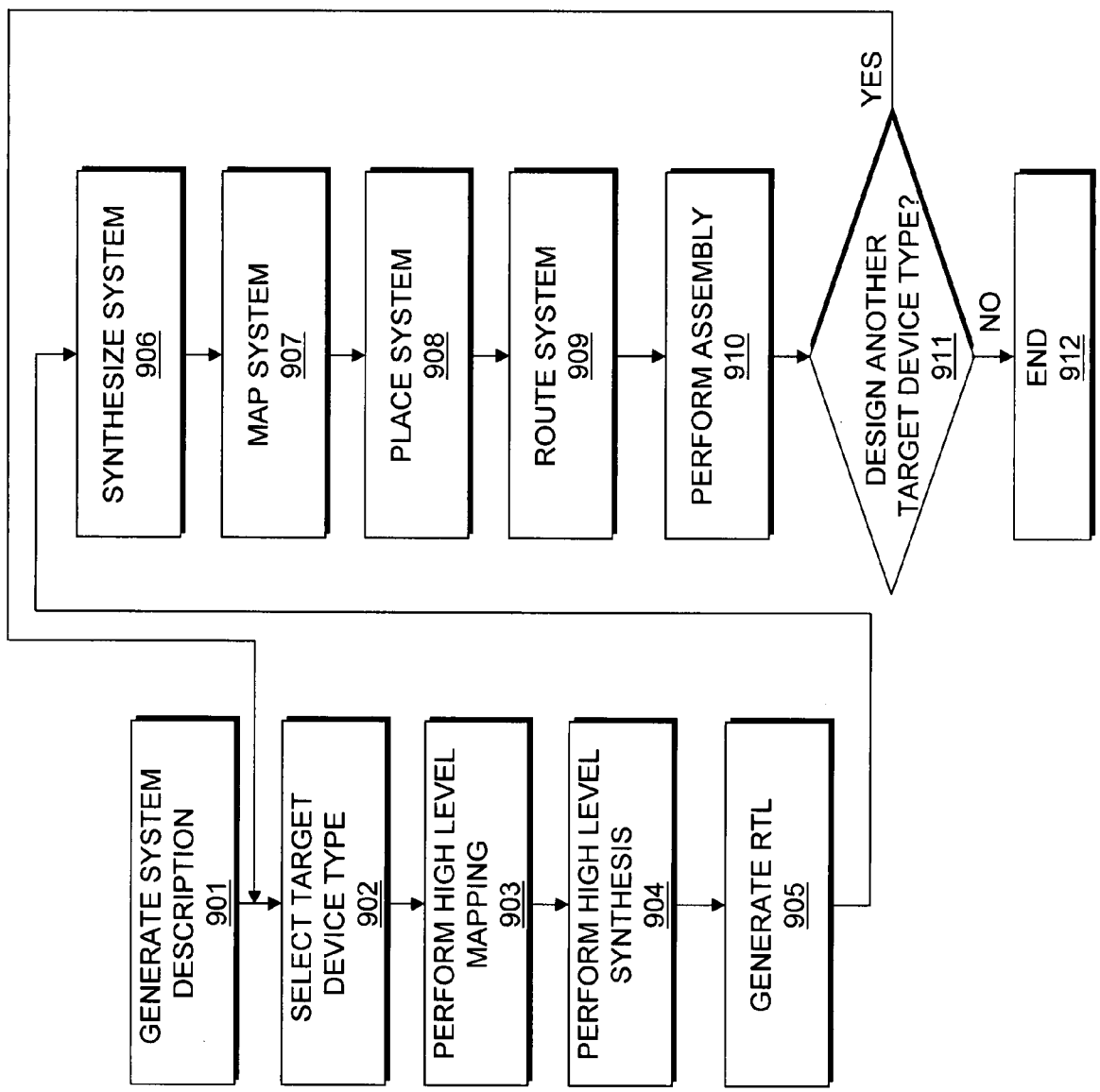
FIG. 9 is a flow chart illustrating a method for designing a system on target devices according to an exemplary embodiment of the present invention.

FIG. 9 is a flow chart illustrating a method for designing a system on a target device according to an embodiment of the present invention. The procedure shown in FIG. 1 may be performed by an EDA tool such as a system designer implemented on a computer system. At 901, a description of the system is generated. According to an embodiment of the present invention, an initial description of the system may be provided by a designer. A structural netlist may be generated from an initial description provided by the design in a programming language construct. Alternatively, a structural netlist may be generated from an initial description provided by the designer in a block based schematic created from a graphical user interface tool. The graphical user interface tool may include a library of functional units that may be selected and connected together to form the block based schematic. The structural netlist describes the components and connectivity of the system.

It should be appreciated that the designer may provide a description of the system at a level of detail that does not include pipelined delays that may be implemented by registers or other delay components that allow the system to satisfy timing requirements such as operating at or above a maximum frequency of a clock for the system as specified by a designer. This allows the designer to provide a description that may be applicable to more than one target devices as opposed to a description suited for a specific target device. The structural netlist functions as an intermediate representation of the description of the system.

At 902, a target device is selected. According to an embodiment of the present invention, the target device is selected or specified by a designer. The target device may be, for example, one of the specific FPGAs previously listed or an FPGA having a different architecture.

At 903, high level mapping is performed on the intermediate representation of the description of the system. According to one aspect of high level mapping, based on the target device selected by the designer one or more components in the intermediate representation of the description of the system may be identified and represented with a component on the target device that is capable of implementing the functionalities of the one or more components efficiently.

According to a second aspect of high level mapping, timing analysis is performed to determine whether a data path through an adder satisfies a timing requirement of the system. If the data path is a critical path and does not satisfy a timing requirement of the system, it may be determined that it would be beneficial to implement the adder with a partitioned adder that utilize a plurality of sub-adders rather than implementing the adder as a single component. Partitioning an adder allows intermediate results generated from sub-adders to be registered. This allows the maximum frequency of a clock on the target device may be increased to meet the timing requirement. Timing analysis may be performed to determine how an adder should be partitioned and how many partitions should be made. A partitioning procedure may be performed to identify components on the target device to support and implement the adder as a partitioned adder having a plurality of sub-adders. According to an embodiment of the present invention, a separate sub-adder may be designated for each partition of an adder, a separate memory to input data into each sub-adder, and/or a separate memory to receive data from each sub-adder. Each sub-adder may add together a first portion of two N bit numbers and provide a carry value to the input of a next sub-adder that adds together a second portion of the two N bit numbers. According to an embodiment of the high level technology mapping unit, the number of logic elements used for implementing a partitioned adder is $P*N+P$, where P is a number of partitions in an adder and N is a number of bits of the adder.

At 904, high level synthesis is performed on the intermediate representation of the description of the system. According to an embodiment of the present invention, based on the target device selected by the designer, pipelined delays are added to the intermediate representation of the system to allow the system to satisfy timing requirements such as the maximum frequency of the clock. The pipelined delays may be implemented using registers and/or other delay components. Each target device may have a unique architecture with resources having unique properties that may require a different number or configuration of delay components in the design to make the system operate efficiently.

According to an embodiment of the present invention, a bit-accurate, cycle-accurate simulation model may be generated from the intermediate representation of the system. The intermediate representation of the system may be used to compute the number of LUTs, multipliers, and memories used in each functional unit to provide feedback to a designer.

At 905, a register transfer language (RTL) representation of the system is generated from the intermediate representation of the description of the system. The RTL representation may be in a hardware description languages such as Verilog or very-high-speed integrated circuit (VHSIC) hardware description language (VHDL).

At 906, synthesis is performed on the system design. According to an embodiment of the present invention, synthesis generates an optimized logical representation of the system from a HDL design definition. The optimized logical representation of the system may include a representation that has a minimized number of functional blocks such as logic gates, logic elements, and registers required for the system.

At 907, technology mapping is performed on the optimized logic design. Technology mapping includes determining how to implement logic gates and logic elements in the optimized logic representation with resources available on the target device. The resources available on the target device may be referred to as "cells" or "components" and may include logic-array blocks, registers, memories, digital signal processing blocks, input output elements, and other components. According to an embodiment of the present invention, an optimized technology-mapped netlist generated from the HDL.

At 908, the mapped logical system design is placed. Placement works on the optimized technology-mapped netlist to produce a placement for each of the functional blocks. According to an embodiment of the present invention, placement includes fitting the system on the target device by determining which resources available on the target device are to be used for specific function blocks in the optimized technology-mapped netlist. According to an embodiment of the present invention, placement may include clustering which involves grouping logic elements together to form the logic clusters present on the target device.

At 909, it is determined which routing resources should be used to connect the components in the target device implementing the functional blocks of the system. During routing, routing resources on the target device are allocated to provide interconnections between logic gates, logic elements, and other components on the target device. The routing procedure may be performed by a router in an EDA tool that utilizes routing algorithms.

At 910, an assembly procedure is performed. The assembly procedure involves creating a data file that includes some of the information determined by the procedure described by 101-105. The data file may be a bit stream that may be used to program the target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium.

At 911, it is determined whether a design is to be generated for another target device. If it is determined that a design is to be generated for another target device type, control returns to 902 where another target device type may be selected. If it is determined that a design is not to be generated for another target device type, control proceeds to 912.

At 912, control terminates the procedure.

Figure 10:
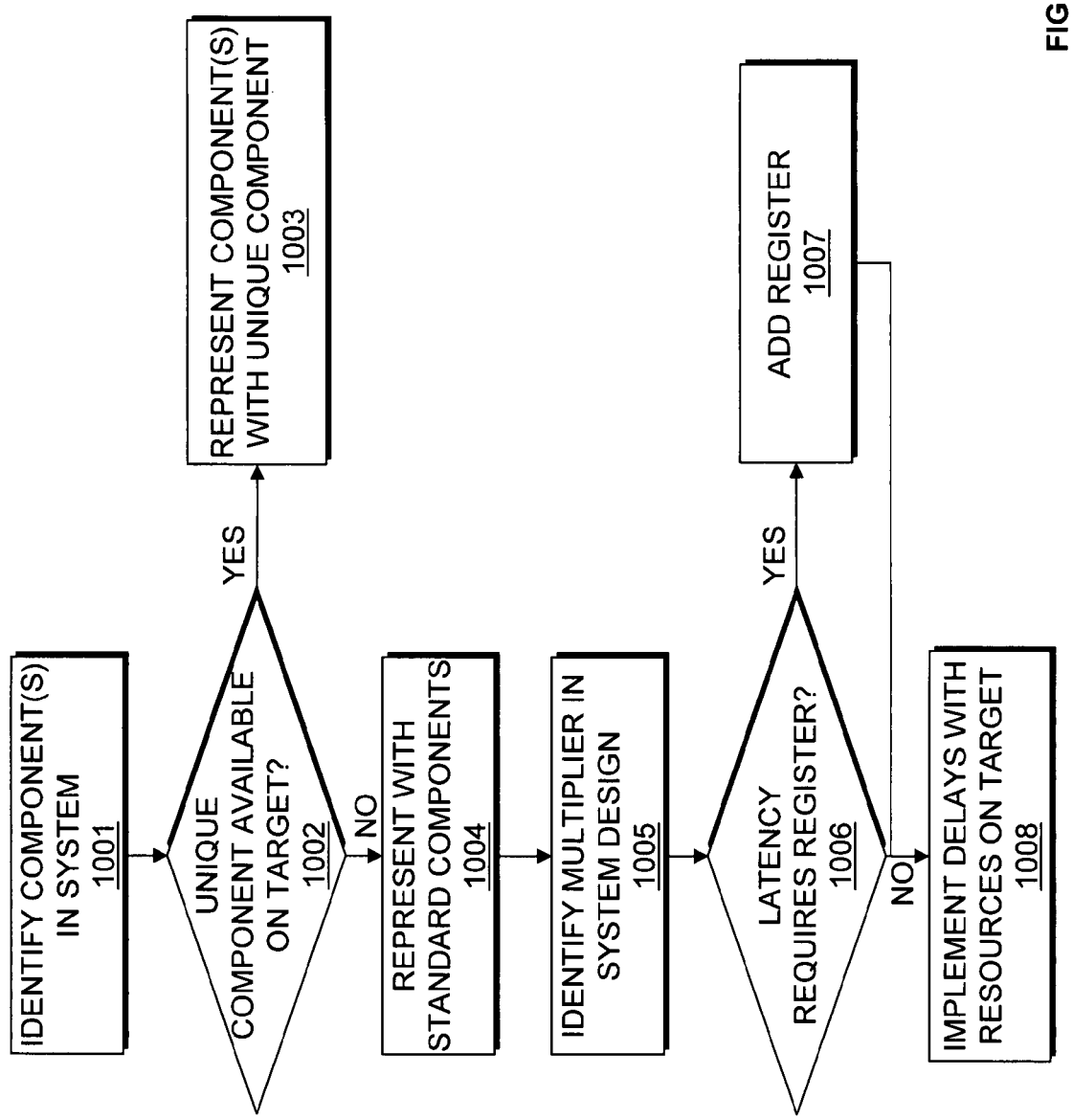
FIG. 10 is a flow chart illustrating a method for performing a first aspect of high level technology mapping according to an exemplary embodiment of the present invention.

FIG. 10 is a flow chart illustrating a method for performing a first aspect of high level mapping according to an exemplary embodiment of the present invention. The procedure illustrated in FIG. 10 may be implemented at 903 shown in FIG. 9. At 1001, one or more components are identified in the intermediate representation of the system.

At 1002, it is determined whether a unique component or resource on a selected target device is available to implement the one or more components identified in the intermediate representation of the system. If a unique component or resource on the selected target device is available, control proceeds to 1003. If a unique component or resource is not available to implement the one or more components identified, control proceeds to 1004.

At 1003, the one or more components identified in the intermediate representation of the system is represented with the unique component. According to an embodiment of the present invention, with respect to procedures 1001-1003, the one or more components identified in the intermediate representation of the system may be a plurality of multipliers and an adder tree and the unique component on the selected target device may be a digital signal processing (DSP) block capable of implementing the plurality of multipliers and adder tree. The one or more components identified in the intermediate representation of the system may be an adder and multiplexer and the unique component on the selected target device may be an Add_SLoad component. The one or more components identified may be a multiplier and the unique component on the selected target device may be a hard multiplier. The hard multiplier may reside on a DSP block. It should be appreciated that other components in the system may be identified and implemented with unique components on the specified target device.

At 1004, the one or more components in the system is represented with standard components on the specified target device. For example, adders, multipliers, multiplexers, or a combinations of these components may be implemented using look up tables and other generic components that may be programmed to implement a variety functions.

At 1005, a multiplier in the system is identified.

At 1006, it is determined whether the latency of an output of the multiplier satisfies a timing requirement. If the latency of the multiplier does not satisfy the timing requirement control proceeds to 1007. If the latency of the multiplier satisfies the timing requirement, control proceeds to 1008.

At 1007, a register is added to the output of the multiplier.

At 1008, delays in the intermediate representation of the system are represented using resources available on the specified target devices.

Figure 11:
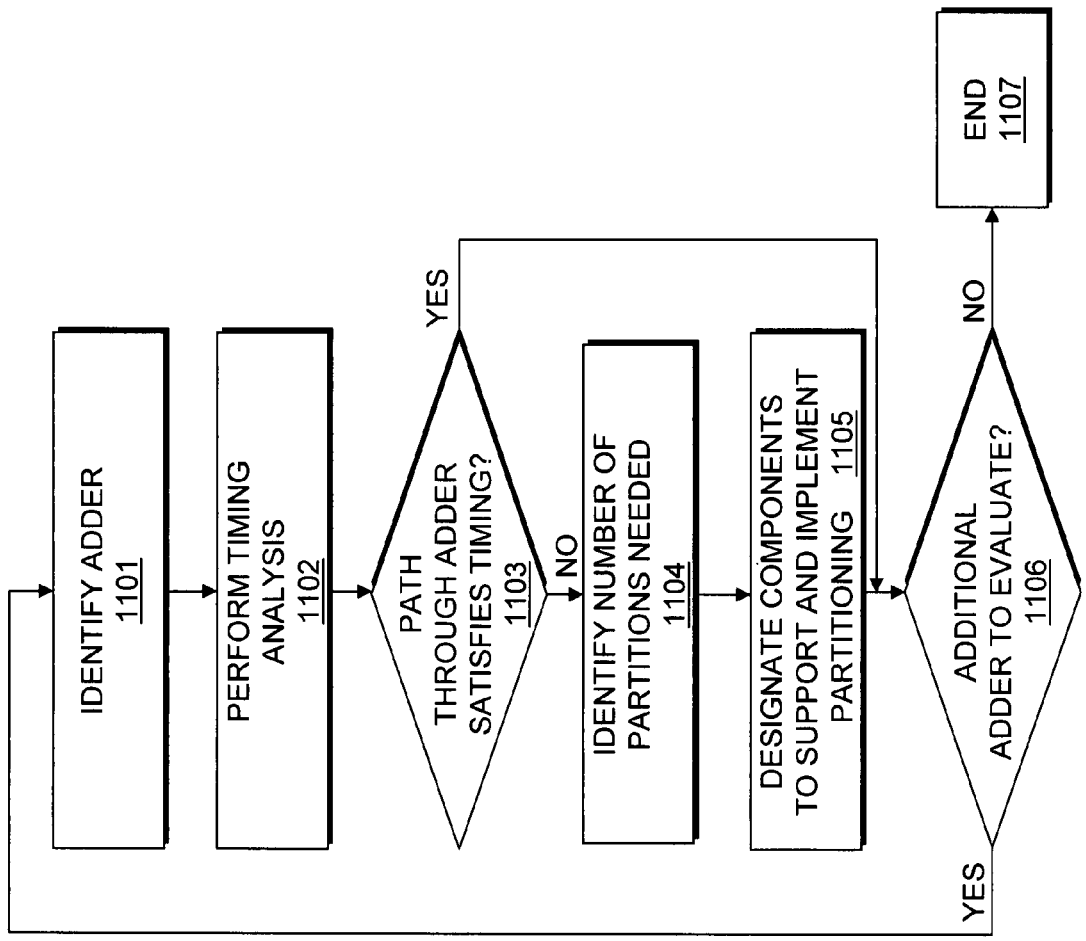
FIG. 11 is a flow chart illustrating a method for performing a second aspect of high level technology mapping according to an exemplary embodiment of the present invention.

FIG. 11 is a flow chart illustrating a method for performing a second aspect of high level technology mapping according to an exemplary embodiment of the present invention. At 1101 an adder is identified in the intermediate representation of the system. The adder may be one that is originally designated for being implemented as a single component. The single component may be a carry chain that does not register any intermediate values until the final result of the adder is computed.

At 1102, a timing analysis is performed. According to an embodiment of the present invention, timing analysis determines whether a data path through the adder satisfies a timing requirement of the system. The timing analysis is specific for the target device selected by the designer. The timing requirement of the system may be for example a maximum frequency of a clock for the system that may be specified by a designer.

At 1103, it is determined whether the data path through the adder satisfies the timing requirement of the system. If the data path through the adder satisfies the timing requirement of the system, control proceeds to 1106. If the data path through the adder does not satisfy the timing requirement of the system, control proceeds to 1104.

At 1104, a number of partitions required for the adder is determined. The number of partitions required may be based upon the results of the timing analysis performed at 1102, the architectural layout and resources available on the target device, the timing requirement of the system, and/or other criteria.

At 1105, components for supporting and implementing the partitioning are designated. According to an embodiment of the present invention, a plurality of sub-adders may be designated for implementing an identified adder, sub-memory components may be designated for implementing a memory that transmits values to the sub-adders or that receives values from the sub-adders, and/or additional registers for buffering data.

At 1106, it is determined whether an additional adder exists to evaluate. If an additional adder exists to evaluate, control returns to 1101. If no additional adder exists to evaluate, control proceeds to 1107.

At 1107, control terminates the procedure.

Figure 12:
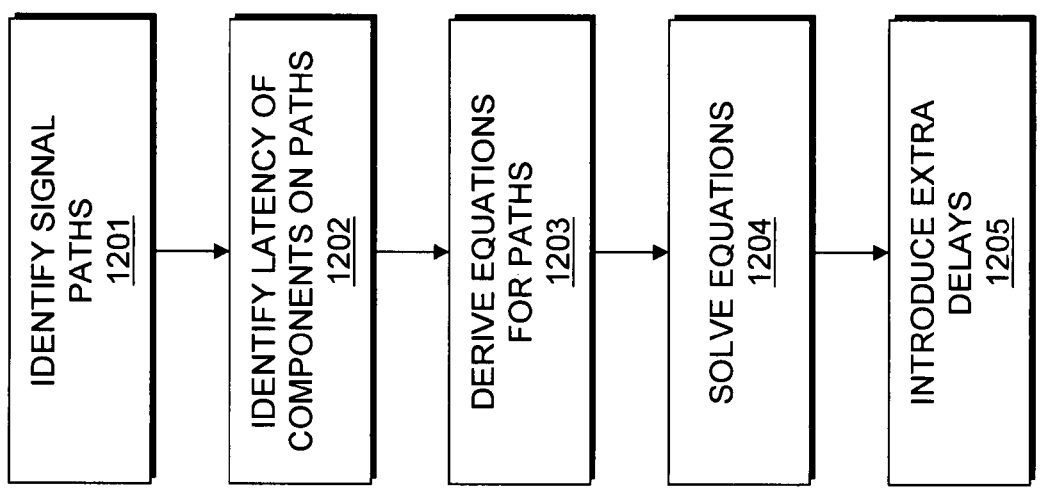
FIG. 12 is a flow chart illustrating a method for performing high level synthesis according to an exemplary embodiment of the present invention.

FIG. 12 is a flow chart illustrating a method for performing high level synthesis according to an embodiment of the present invention. At 1201, signal paths between a source (input) and destination (output) are identified.

At 1202, the latency of components along the signal path is identified.

At 1203, equations characterizing the delay along the signal paths are generated. According to an embodiment of the present invention, all related signals from the source arrive at the destination on the same clock cycle.

At 1204, the equations characterizing the delay along the signal paths are solved. According to an embodiment of the present invention, the equations are solved using integer linear programming where the delays along the signal paths are minimized.

At 1205, pipeline delay is added to signal paths having non-zero values.

FIGS. 9 through 12 are flow charts illustrating methods according to embodiments of the present invention. The techniques illustrated in these figures may be performed sequentially, in parallel or in an order other than that which is described. The techniques may be also be performed one or more times. It should be appreciated that not all of the techniques described are required to be performed, that additional techniques may be added, and that some of the illustrated techniques may be substituted with other techniques.

Embodiments of the present invention may be provided as a computer program product, or software, that may include an article of manufacture on a machine accessible or machine readable medium having instructions. The instructions on the machine accessible or machine readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "machine accessible medium" or "machine readable medium" used herein shall include any medium that is capable of storing, or encoding a sequence of instructions for execution by the machine and that cause the machine to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

In the foregoing specification embodiments of the invention has been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system to be implemented on a target device, comprising:
generating an intermediate representation of the system from a description provided by a designer;
identifying an adder from the intermediate representation of the system before the intermediate representation of the system is transformed into a register transfer level (RTL) description; and
designating components on the target device to support and implement the adder as a partitioned adder having a plurality of sub-adders each registering an intermediate result, wherein at least one of the generating, identifying, and designating procedures are performed by a processor.

2. The method of claim 1, further comprising determining whether the adder should be implemented as a partitioned adder.

3. The method of claim 1, further comprising:
determining whether a timing constraint of the system may be satisfied with the adder being implemented as a single adder component on the target device; and
identifying a number of partitions to make on the adder to allow the timing constraint to be satisfied.

4. The method of claim 3, wherein the timing constraint is a maximum frequency of a clock on the target device.

5. The method of claim 1, wherein a separate sub-adder is designated for each partition of the adder and a separate memory is utilized to input data into each sub-adder.

6. The method of claim 1, wherein the number of logic elements used for implementing the partitioned adder is P*N+P, where P is a number of partitions of the adder and N is a number of bits of the adder.

7. The method of claim 1, further comprising generating a register transfer language (RTL) representation of the system, that includes pipelined delays to facilitate timing of the system as implemented on the target device as identified by a designer, from a description of the system without pipelined delays.

8. The method of claim 1, wherein identifying the adder comprises identifying the adder outputting a result into another adder.

9. The method of claim 8, further comprising designating components on the target device to support and implement the another adder as another partitioned adder having another plurality of sub-adders.

10. The method of claim 9, wherein a separate sub-adder is designated for each partition of the adder and the another adder and a separate memory is utilized to input data into each sub-adder of the partitioned adder.

11. The method of claim 9, further comprising:
determining whether a timing constraint of the system may be satisfied with the adder and the another adder being implemented as a single adder components on the target device; and identifying a number of partitions to make on the adder and the another adder to allow the timing constraint to be satisfied.

12. The method of claim 11, wherein the timing constraint is a maximum frequency of a clock on the target device.

13. The method of claim 1, wherein the intermediate representation of the system includes a structural netlist of the system.

14. An article of manufacture comprising a machine accessible medium including sequences of instructions, the sequences of instructions including instructions which when executed causes the machine to perform:
generating an intermediate representation of the system from a description provided by a designer;
identifying an adder from the intermediate representation of the system before the intermediate representation of the system is transformed into a register transfer level (RTL) description; and
designating components on the target device to support and implement the adder as a partitioned adder having a plurality of sub-adders each registering an intermediate result.

15. The article of manufacture of claim 14, further comprising instructions which when executed further causes the machine to perform:
determining whether a timing constraint of the system may be satisfied with the adder being implemented as a single adder component on an target device; and
identifying a number of partitions to make on the adder to allow the timing constraint to be satisfied.

16. The article of manufacture of claim 15, wherein the timing constraint is a maximum frequency of a clock on the target device.

17. The article of manufacture of claim 14, wherein a separate sub-adder is designated for each partition of the adder and a separate memory is utilized to input data into each sub-adder.

18. The article of manufacture of claim 14, wherein the intermediate representation of the system includes a structural netlist of the system.

19. A system designer, comprising:
a high level synthesis unit to identify an adder from an intermediate representation of a system before the intermediate representation of the system is transformed into a register transfer level (RTL) description of the system and designating components on a target device to support and implement the adder as a partitioned adder having a plurality of sub-adders each registering an intermediate result, wherein the intermediate representation of the system is generated from a description provided by a designer.

20. The system designer of claim 19, wherein the high level synthesis unit comprises a timing analysis unit to determine whether a data path through the adder satisfies a timing requirement of the system.

21. The system designer of claim 19, wherein the high level synthesis unit comprises a timing analysis unit to determine how many partitions should be made.

22. The system designer of claim 19, wherein the high level synthesis unit generates a register transfer language (RTL) representation of the system to be implemented on a target device specified by the designer from the intermediate representation of the system, the RTL representation including pipelined delays to allow the system to satisfy a maximum frequency of a clock as implemented on the target device.

23. The system designer of claim 19, further comprising a high level mapping unit to identify one or more components in the description and represent the one or more components in the description with a component on the target device that is capable of implementing the functionalities of the one or more components efficiently, wherein the component is uniquely available to the target device.

24. The system designer of claim 19, wherein the intermediate representation of the system includes a structural netlist of the system.

* * * * *